(12) United States Patent
Normoyle et al.

(10) Patent No.: US 7,398,449 B1
(45) Date of Patent: *Jul. 8, 2008

(54) ENCODING 64-BIT DATA NIBBLE ERROR CORRECT AND CYCLIC-REDUNDANCY CODE (CRC) ADDRESS ERROR DETECT FOR USE ON A 76-BIT MEMORY MODULE

(75) Inventors: Kevin B. Normoyle, Santa Clara, CA (US); Robert G. Hathaway, Sunnyvale, CA (US)

(73) Assignee: Azul Systems, Inc., Mountain View, CA (US)

( * ) Notice: Subject to any disclaimer, the term of this patent is extended or adjusted under 35 U.S.C. 154(b) by 380 days.

This patent is subject to a terminal disclaimer.

(21) Appl. No.: 11/161,042

(22) Filed: Jul. 20, 2005

Related U.S. Application Data

(63) Continuation-in-part of application No. 10/710,066, filed on Jun. 16, 2004, now Pat. No. 7,203,890.

(51) Int. Cl.
*H03M 13/00* (2006.01)
(52) U.S. Cl. ...................... 714/767; 714/768
(58) Field of Classification Search .................. 714/767, 714/768
See application file for complete search history.

(56) References Cited

U.S. PATENT DOCUMENTS 4,672,609 A * 6/1987 Humphrey et al. .......... 714/719

(Continued)

OTHER PUBLICATIONS

P. Koopman and T. Chakravarty, "Cyclic Redundancy Code (CRC) Polynomial Selection for Embedded Networks", *Int'l Conf. On Dependable Sys. and Networks.*, DSN-2004, pp. 1-10, 2004.

(Continued)

*Primary Examiner*—Joseph D Torres
(74) *Attorney, Agent, or Firm*—gPatent LLC; Stuart T. Auvinen

(57) ABSTRACT

A memory system provides data error detection and correction and address error detection. A cyclical-redundancy-check (CRC) code generates address check bits. A 32-bit address is compressed to 6 address check bits using the CRC code. The 6 address check bits are concatenated with 64 data bits and 2 flag bits to generate a 72-bit check word. The 72-bit check word is input to an error-correction code (ECC) generator that generates 12 check bits that are stored in memory with the 64 data bits. A 76-bit memory module can store the 64 data and 12 check bits. Nibble errors can be corrected, and all nibble+1 bit errors can be detected. Also, a 6-bit error in a sequence of bits can be detected. This allows all errors in the 6-bit CRC of the address to be detected. The CRC code and ECC are ideal for detecting double-bit errors common with multiplexed-address DRAMs.

12 Claims, 8 Drawing Sheets

U.S. PATENT DOCUMENTS

| | | | | |
|---|---|---|---|---|
| 4,713,816 | A | | 12/1987 | Van Gils .................... 714/765 |
| 5,226,043 | A | * | 7/1993 | Pughe et al. ................ 714/768 |
| 5,291,498 | A | | 3/1994 | Jackson et al. ............. 714/758 |
| 5,691,996 | A | * | 11/1997 | Chen et al. .................. 714/805 |
| 5,751,744 | A | | 5/1998 | Babb .......................... 714/800 |
| 5,761,221 | A | * | 6/1998 | Baat et al. ................... 714/767 |
| 5,768,294 | A | * | 6/1998 | Chen et al. .................. 714/766 |
| 5,917,838 | A | | 6/1999 | Wardrop ..................... 714/767 |
| 6,044,483 | A | | 3/2000 | Chen et al. .................. 714/762 |
| 6,125,467 | A | | 9/2000 | Dixon ......................... 714/763 |
| 6,574,774 | B1 | * | 6/2003 | Vasiliev ...................... 714/800 |
| 6,732,291 | B1 | | 5/2004 | Kilmer et al. ................. 714/7 |
| 2005/0081085 | A1 | | 4/2005 | Ellis et al. .................... 714/5 |

OTHER PUBLICATIONS

S. Kaneda and E. Fujiwara, "Single Byte Error Correcting—Double Byte Error Detecting Codes for Memory Systems", *IEEE Trans. Computers*, vol. C-31, No. 7, pp. 596-602, Jul. 1982.

M. Hamada and E. Fujiwara, "A Class of Error Control Codes for Byte Organized Memory Systems—SbEC-(Sb+S)ED Codes", *IEEE Trans. Computers*, vol. 46, No. 1, pp. 105-109, Jan. 1997.

* cited by examiner

ENCODING 64-BIT DATA NIBBLE ERROR CORRECT AND CYCLIC-REDUNDANCY CODE (CRC) ADDRESS ERROR DETECT FOR USE ON A 76-BIT MEMORY MODULE

RELATED APPLICATION

This application is a continuation-in-part of the co-pending application for "Encoding 64-bit Data Nibble Error Correct and Cyclic-Redundancy Code (CRC) Address Error Detect for Use on a 76-bit Memory Module", U.S. Ser. No. 10/710,066, filed Jun. 16, 2004.

FIELD OF THE INVENTION

This invention relates to error detection and correction, and more particularly to address error detection merged with data error detection and correction.

BACKGROUND OF THE INVENTION

Current software tends to be intolerant of any hardware error. Hardware should be designed with a mean-time-between-failure (MTBF) that has a very large value, even in the presence of physical behaviors that cause errors at higher rates. For memories, this is typically achieved by adding redundant information to storage in the form of an error correcting code that can correct the expected patterns of errors.

In addition, software and users want to have a much larger mean-time-between-undetected errors. It is better to have the system fail in a predictable way, rather than use erroneous data silently (for instance, in managing a bank account). Recovery for these errors, not corrected by hardware, but detected, can be at some higher level of software, or as a full system restart.

Ideally, any error would be always detected, but that requires too much additional redundant storage. Note that the undetected error rate can never go to zero. The design of codes for DRAM error protection is a balance between predicted error modes, error correction capability to match a system MTBF goal, and error detection capability to match an undetected error goal.

Digital memories are susceptible to errors caused by a variety of sources. Cosmic radiation can flip the state of individual memory cells. Pattern-sensitive capacitive coupling, noise, and hardware failures such as shorts can occur, causing multiple bits to be read incorrectly. Sometimes entire memory chips can fail. When a memory contains several memory chips, such as on a memory module, a one-chip failure may produce a multi-bit error, such as a 4-bit error in a 72-bit memory word.

Additional bits are often included in the memory for storing an error-correction code (ECC). These additional ECC bits can be used to detect an error in the data bits being read, and can sometimes be used to correct those errors. Typically, a code is selected such that the data is unmodified. Error detection and correction is performed by comparing the check bits read against the correct check bits for that data. Such a code is considered in "systematic form".

Various codes can be used for the ECC bits, such as the well-known Hamming codes. A class of codes known as Single-byte Error-Correcting/Double-byte Error-Detecting (SbEC/DbED) codes can correct any number of errors within a "byte" and detect pairs of such errors. The "byte" may be a length other than 8 bits. For example, a S4EC/D4ED code can correct 4-bit (nibble) errors, and detect but not correct 8-bit (2 nibble) errors. These codes are especially useful since they can detect double-chip errors where all 4 bits output by two different memory chips are faulty. Single-chip errors can be corrected.

A SbEC/DbED code with $3*b$ check bits can be used with up to $b*(2**b+2)$ total bits (data+check). These are known as Reed-Solomon SbEC/DbED codes. When $b=4$, only a relatively small a number of data bits can be used (60). To increase the allowed number of data bits, $4*b$ check bits are typically used, such as 128 data bits with 16 check bits. The increased number of check bits allows a larger number of data bits to be used.

While such S4EC/D4ED codes are useful for protecting against failures in whole memory chips, and in the wires to and from the memory chips, failures can also occur in the address lines to one or more of the memory chips. For example, a solder connection to an address pin of one of the memory chips might start failing after some time. Many memory chips use multiplexed addresses, where the address is applied over the same address lines in two parts, a row address part and a column address part. A single solder connection can thus cause two bits of the address to be faulty. It is desirable to protect against such 2-bit address errors. Some of the memory errors may be caused by cosmic radiation. This may cause a wrong address to be read from within the memory chip. This address may be wrong in an unknown number of bits.

As memory sizes increase, more and more address bits are used. Protecting these larger addresses against errors becomes more important.

FIG. 1 shows a prior-art memory with data ECC and address parity. Write data is stored in data RAM 10, while ECC generator 16 calculates the ECC bits that correspond to the value of the data bits being written into data RAM 10. These data ECC bits are written into data ECC RAM 12 at the same write-address W_ADR as the data.

During reading, the read address R_ADR is applied to read out data from data RAM 10 and data ECC bits from data ECC RAM 12. Read ECC generator 20 re-generates an ECC value from the data being read from data RAM 10. The new ECC value from read ECC generator 20 is compared to the stored ECC bits from data ECC RAM 12 by ECC checker 24 to determine if any errors occurred in the read data. A data error can be signaled when the stored ECC does not match the re-generated ECC. Some of these data errors may be corrected by an ECC corrector (not shown).

To protect against errors in the address, the write address W_ADR is applied to parity generator 18, which generates the parity of the write address. The generated address parity is then stored in address parity RAM 14 at the write address.

During reading, the stored address parity is read from address parity RAM 14, while the parity of the read address R_ADR is generated by read parity generator 22. The generated read-address parity is compared to the stored parity from address parity RAM 14 by parity comparator 26. When the parity values mis-match, and address error is signaled. The memory read can be re-tried several times before a failure is signaled.

FIG. 2 shows address parity concatenated with data ECC bits. The address parity and data ECC bits can be stored in separate RAMs, or can be concatenated and stored in the same RAM. A data word of 128 bits may need 16 data ECC bits to correct errors up to 4 bits in a nibble and to detect pairs of such errors in separate nibbles. A 32-bit address protected with a standard Hamming code would need 6 bits, allowing detection of all 1 and 2 bit errors in the address. Thus a total of 22 check bits are needed to protect against both address and data errors.

Some memories may lack a sufficient width to store all of the check bits. For example, there may only be space for 16 check bits. It may be undesirable to reduce the number of data ECC bits to fit in some address parity bits. There are trade-offs among the number of check bits and expense of the memory system, the largest multi-bit data error that can be corrected and detected, and the degree of detection of address errors. Adding additional check bits for the address parity is often undesirable. Reducing the number of address check bits can reduce detection for multi-bit address errors. The use of multiplexed address bits causes 2-bit address errors to be as likely as 1-bit address errors in a real system.

The address parity bits could be exclusive-OR'ed (XOR'ed) into the data ECC bits. This has the advantage of not requiring additional check bits. However, if the address has a parity error, the extracted data ECC bits may not be able to correct an otherwise correctable data error. Thus some data correction ability may be lost. This happens if the address error causes an error syndrome to be created that matches the error syndrome for an otherwise correctable data error.

The parent application solved this problem by generating a more complex cyclical-redundancy-check (CRC) code. CRC codes are characterized by a generator polynomial. CRC codes have well-known benefits for increased error coverage, for a given number of check bits. The benefits include better coverage for random numbers of errors, and better coverage for errors that occur in consecutive bits (bursts).

The address CRC bits were merged into two nibbles of the data ECC bits. Since the address check bits were merged with the data ECC bits, additional bits were not needed for storing the address check bits.

FIG. 3 shows generation of a combined data and address check word according to the parent application. Data to be written to memory is input to data ECC generator 32. In this example 16 bytes (128 bits) of write data W_DATA are input, but other widths are contemplated. Data ECC generator 32 generates a S4EC/D4ED ECC code that can correct errors of 1-4 bits, and detect but not correct errors from two groups of 1-4 bits in the 128-bit data. Various strategies are used to generate this type of ECC code. Data ECC generator 32 outputs 16-bit data ECC codeword 36, which has four nibbles DE3, DE2, DE1, DE0.

The address to write the data to, W_ADR, is a 32-bit address. The write address is applied to CRC-code generator 34, which uses a generator polynomial to operate on the address, which is also represented as a polynomial, to generate a 4-bit output, labeled AE, address error check bits 38. The CRC generation is performed in modulo-2 arithmetic, which causes the logic function to be a series of XOR's.

Address error check bits 38 (AE) are merged with two of the four nibbles of data ECC codeword 36. XOR gates 44 merges the 4 bits of address error check bits 38 with the lowest-order nibble DE0 of data ECC codeword 36 to generate merged ECC nibble XE0 of merged ECC codeword 30. XOR gates 42 redundantly merges the 4 bits of address error check bits 38 with the next-lowest-order nibble DE1 of data ECC codeword 36 to generate merged ECC nibble XE1 of merged ECC codeword 30.

The upper two nibbles of data ECC codeword 36 are copied to the upper two nibbles of merged ECC codeword 30. Thus merged ECC codeword 30 contains two un-altered data ECC nibbles that contain only data ECC information and two merged nibbles that contain both data ECC and address check information.

While merging the address CRC with data ECC bits according to the parent application is useful, the particular code shown in the example of FIG. 3 has 16 check bits for 128 data bits. Some memories are accessible as 128-bit data words, but others are accessible as smaller 64-bit data words. These 64-data-bit memories may be constructed from smaller-width memory modules. For example, a memory may be organized to have 64 data bits and use smaller-width memory modules. A code optimized for these smaller memory modules is desirable. Separation of address and data check bits is also desirable to better trace back address errors.

DETAILED DESCRIPTION

The present invention relates to an improvement in memories with error-correction codes. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
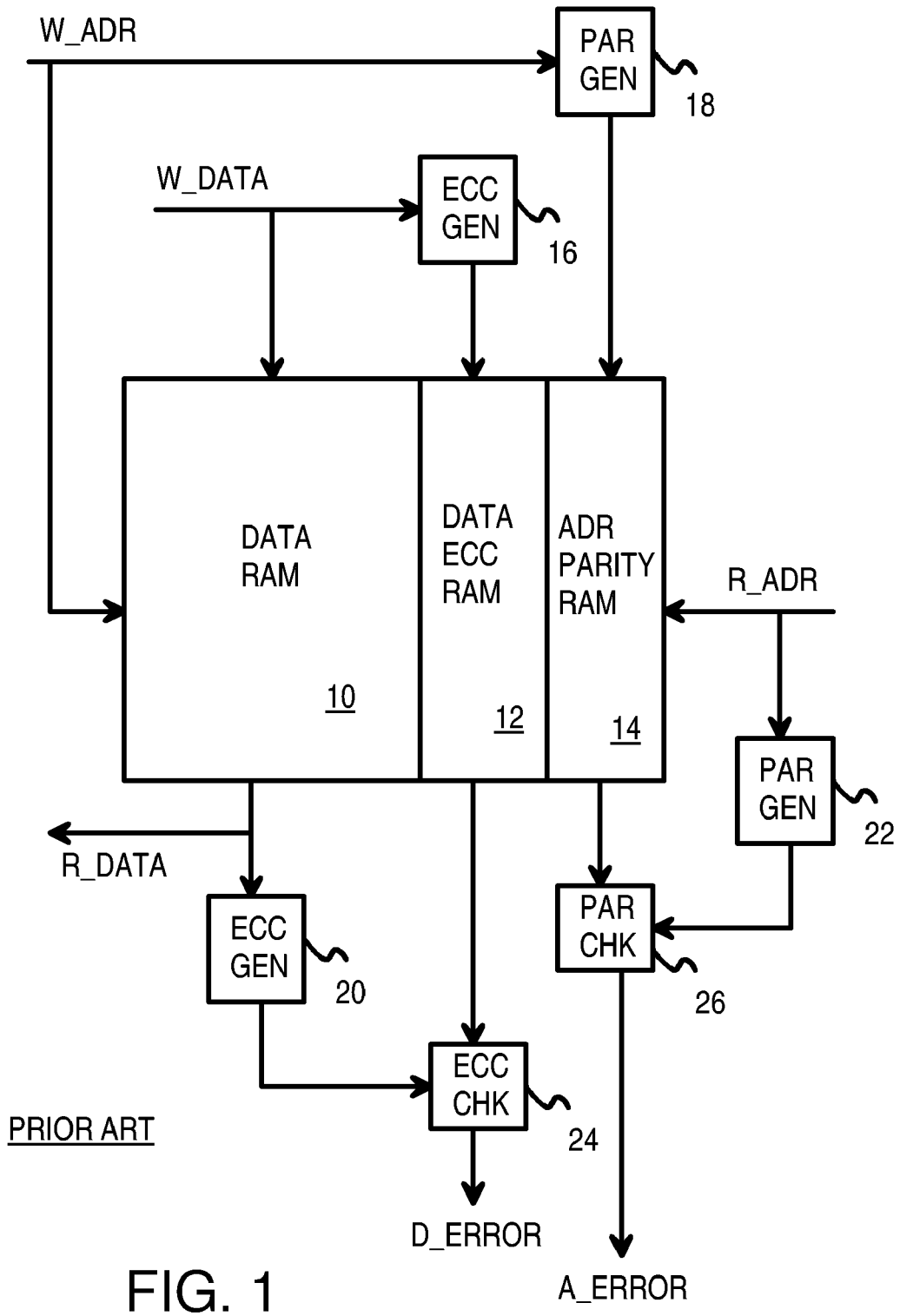
FIG. 1 shows a prior-art memory with data ECC and address parity.
Figure 2:
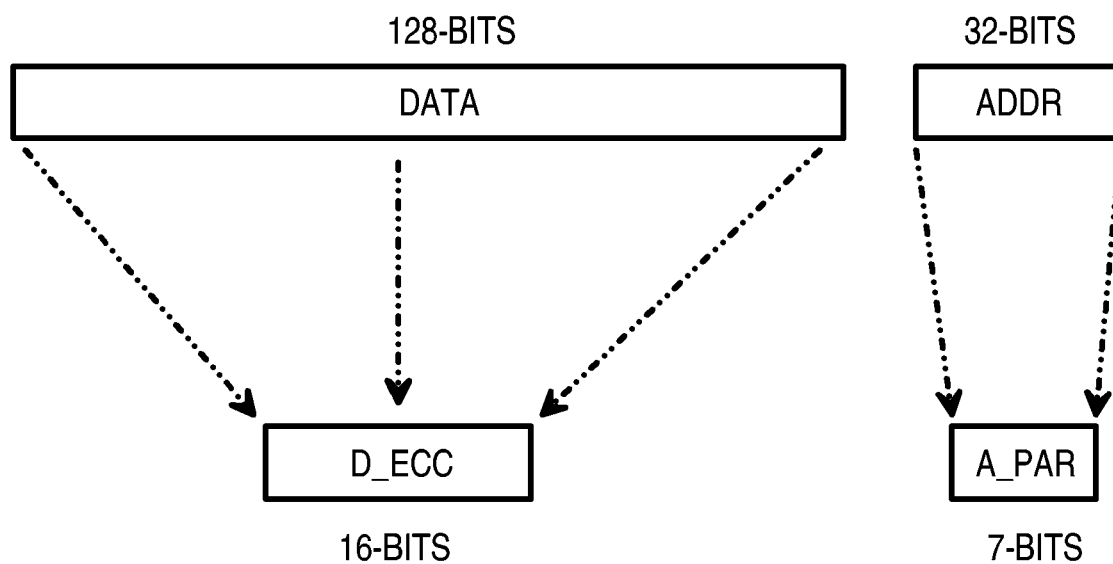
FIG. 2 shows address parity concatenated with data ECC bits.
Figure 3:
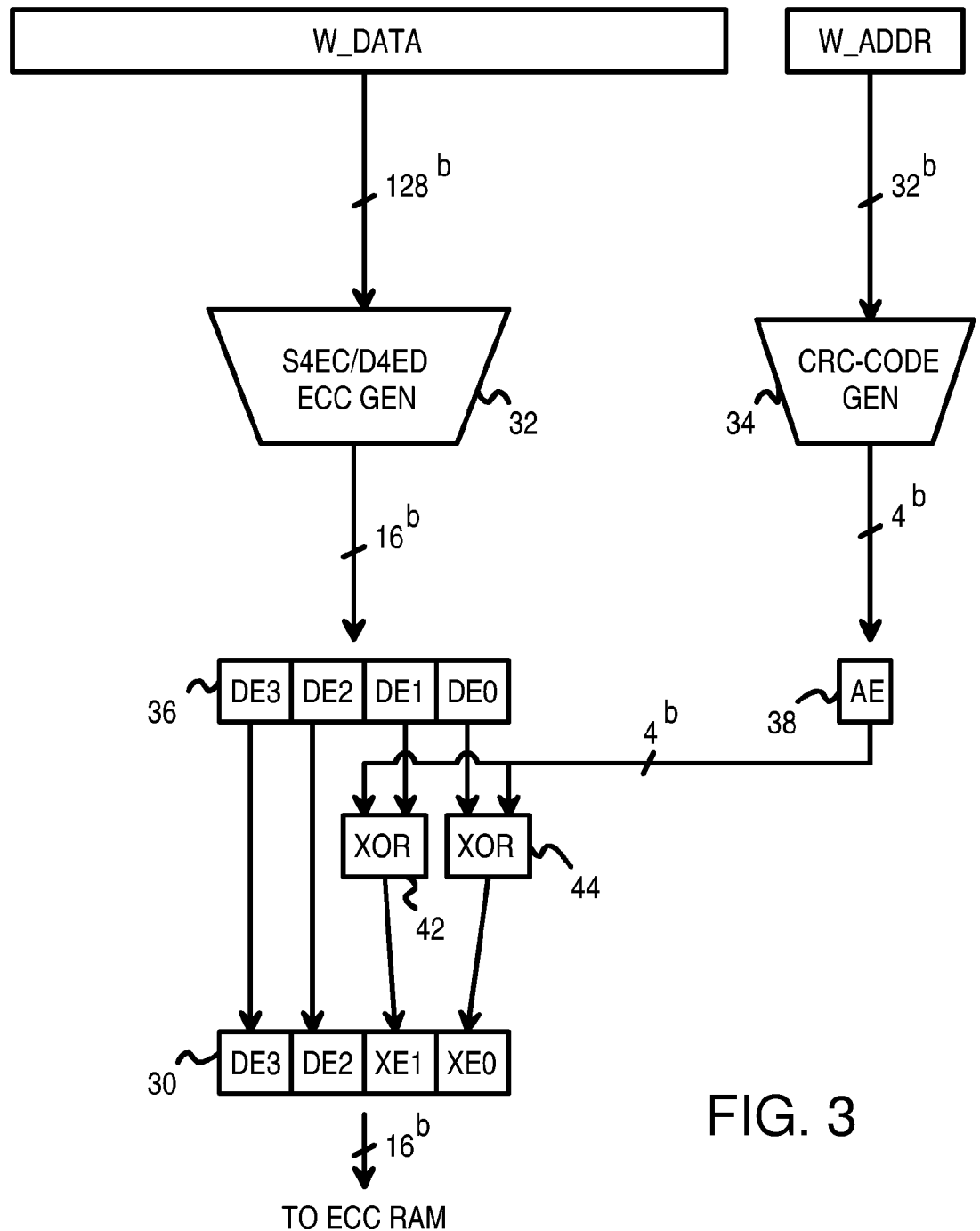
FIG. 3 shows generation of a combined data and address check word according to the parent application.
Figure 4:
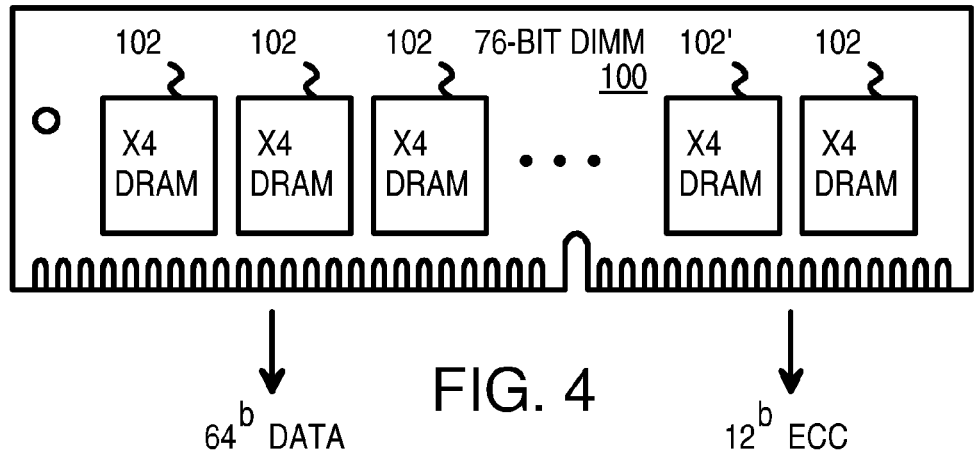
FIG. 4 shows a 76-bit memory module using ×4 DRAM chips.

FIG. 4 shows a 76-bit memory module using ×4 DRAM chips. A memory system may be accessible as 64-bit data words. Memory module 100 outputs 64 data bits over a bus that connects to a motherboard through edge-connector leads on the bottom edge of memory module 100. These edge-connector leads are inserted into a memory module socket on the motherboard. Memory module 100 may be a Dual-Inline Memory Module (DIMM).

Memory module 100 has a substrate that has several dynamic-random-access memory (DRAM) memory chips mounted thereon. Memory chips 102 each have four bits of data input/output and are known as ×4 DRAMs. Sixteen ×4 memory chips 102 could output the 64 data bits.

Additional memory chips 102 may be mounted to the substrate board of memory module 100 to store error-correction code (ECC) check bits. A standard 72-bit DIMM has two additional ×4 memory chips 102, so that 8 ECC check bits are stored for the 64 data bits.

The inventors have realized that some memory modules have room for one more ×4 memory chip 102'. Then memory module 100 is a 76-bit DIMM. With three ×4 memory chips 102, memory module 100 could store 12 ECC check bits for the 64 data bits.

Figure 5A:
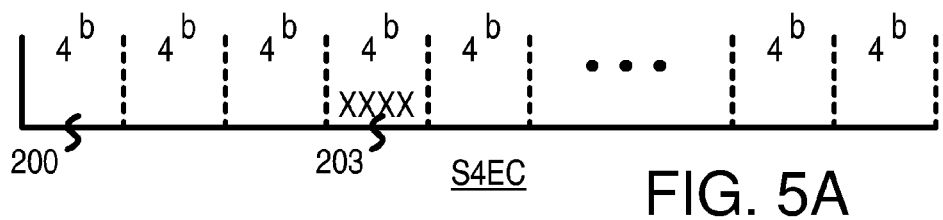
FIGS. 5A-D show errors that are detectable by various ECC codes.

Various ECC codes could be used to generate the 12 ECC check bits. The ability to detect and correct errors varies with the particular ECC code. FIGS. 5A-D show errors that are detectable by various ECC codes. For example, a S4EC/S4ED code can detect a 4-bit error within an aligned nibble as FIG. 5A shows. Nibble error 203 is detected by the S4EC code. Nibble error 203 could be in any of the aligned 4-bit nibbles 200 in the data word.

Detecting an aligned nibble error is useful in many memory systems. When the memory modules contain ×4 DRAM chips, an entire memory chip may fail, causing all 4 data bits to fail. Thus ×4 chips may cause aligned-nibble errors.

Figure 5B:
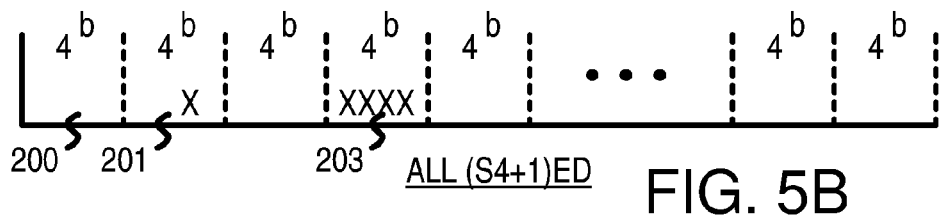

FIG. 5B shows a S4EC/(S4+1)ED code detecting 5 error bits. A S4EC/(S4+1)ED code can detect a more complex error. For example, nibble error 203 is a 4-bit error aligned to the nibble boundary that is detected. The code also detects a 5th error bit, single-bit error 201 that occurs in another of nibbles 200.

The S4EC/(S4+1)ED code allows detection of a failed ×4 DRAM chip, plus another single-bit error in another DRAM chip. The ×4 DRAM chip could fail due to a loose solder connection to the chip's power or ground, while the single-bit error could be a soft (radiation-induced) error in another DRAM chip.

Figure 5C:
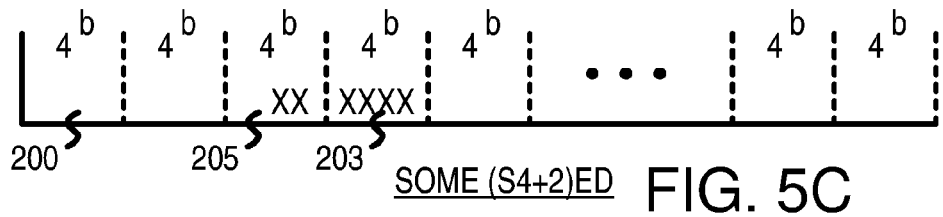
Figure 5D:
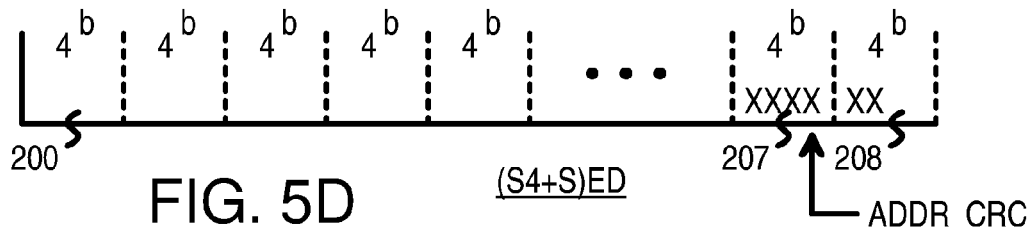

The S4EC/(S4+1)ED code is guaranteed to detect all such 4+1 errors, regardless of which of nibbles 200 that nibble error 203 occurs in, and where the single-bit error occurs. Actual codes also detect some other more-complex errors, but may not detect all such more-complex errors. FIG. 5C shows detection of a S4+2 error by the S4EC/(S4+1)ED code. Simulation can determine which of these more-complex error are detected by the code and which are not detected. For example, nibble error 203 is detected and 2-bit error 205 is also detected. Detection depends on the exact positions of errors 203, 205 within nibbles 200. Some positions of errors 203, 205 are undetectable while other positions are detectable. Thus partial coverage of these more-complex 6-bit errors also occurs for the S4EC/(S4+1)ED code.

The inventor has carefully examined various error codes and verified by simulation that some S4EC/(S4+1)ED codes can detect a sequential 6-bit error. A 6-bit error in last nibbles 207, 208 is detectable using a S4EC/(S4+1)ED code. Errors in these 6 bit-positions in last nibbles 207, 208 are detectable regardless of the numeric value of these 6 bits.

The inventor has realized that these 6 bit-positions may carry a 6-bit address CRC. Since an error in a single address bit could cause many of the bits in a CRC to fail, detection of multi-bit CRC errors is useful. A two-bit error in a 32-bit address could result in a 6-bit CRC that had all 6 CRC bits being different. Thus detecting a 6-bit error in last nibbles 207, 208 is quite useful when a 6-bit CRC of an address is carried by these nibbles.

Last nibbles 207, 208 can be virtual data bits that are separate from the 64 data bits that are stored on the memory module. The actual 64 data bits stored on the memory module are combined with a 6-bit CRC of the address to form a 70-bit check word. Another 2 virtual data bits are used for error-propagation or other flags. Thus a 72-bit check word is generated for the 64-bit data and the address and flags.

This 72-bit check word is input to an ECC checker to detect errors on data reads. On data writes, the 64 data bits that are written to the memory module are concatenated with the 6-bit address CRC and the 2 flag bits to generate the 72-bit check word. The 72-bit check word is input to a ECC code generator that generates the 12 check bits. The 12 check bits are written to the memory module along with the 64 data bits.

The inventors have discovered that an (84,72) error code may be used with a 76-bit memory module. This type of code has 72 data bits and 84 total bits, with 84−72=12 ECC check bits. Since the memory module has only 64 data bits, the extra 8 bits (72-64) are virtual data bits. These virtual data bits are not stored on the memory module but exist when generating and checking ECC. These virtual data bits may carry address error check information, allowing the 12-bit ECC code to be generated from the 64 data bits and the 8 virtual data bits that carry address information. Since a 32 or 38-bit address may be used, and only 8 virtual data bits are available, the 32-bit address is compressed to 6 bits using a CRC.

Figure 6:
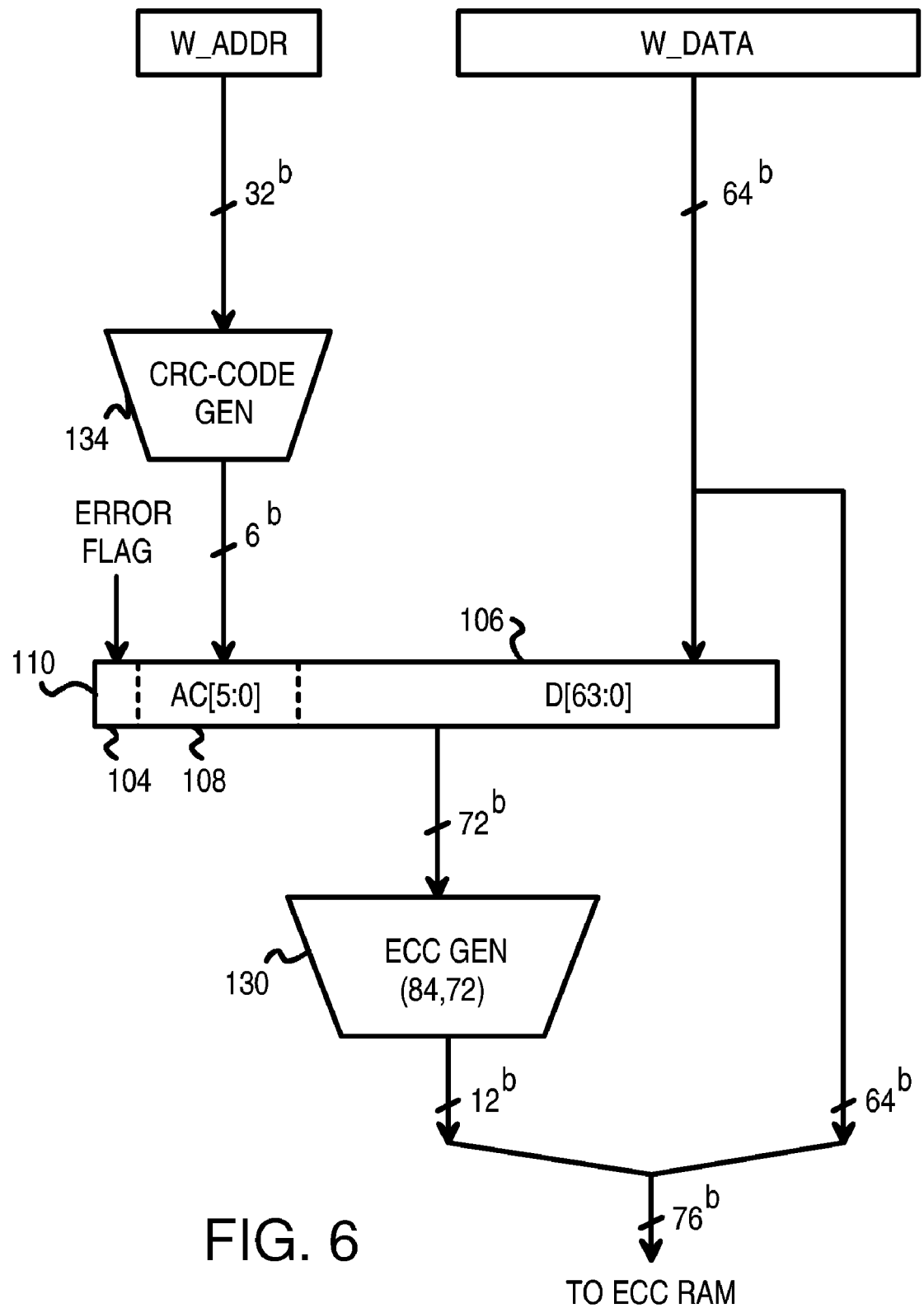
FIG. 6 is a diagram of ECC generation using data bits and virtual data bits that contain an address CRC.

FIG. 6 is a diagram of ECC generation using data bits and virtual data bits that contain an address CRC. Check word 110 contains the 64 data bits D[63:0], data bits 106, that are being written into the memory module concatenated with address CRC bits 108 and flag bits 104 to form a 72-bit check word.

CRC generator 134 receives a 32-bit address for the data being written, and performs mathematical operations to generate address CRC bits 108. Exclusive-OR (XOR) logic gates may be used by CRC generator 134 in a hardware implementation, or a series of programmable steps may be executed on a programmable implementation such as on a programmable processor. CRC generator 134 generates 6 output bits AC[5:0] as address CRC bits 108. These 6 bits are placed in the last 2 nibbles (or first 2 nibbles) of check word 110.

The extra 2 bits in check word 110 may be used as flags, or may simply default high or low. For example, when an upstream error is detected, an error-propagation flag can be set as one of the bits of flag bits 104.

The 72 bits of check word 110 are input to ECC generator 130. ECC code generator 130 performs operations on the 72 input bits to generate 12 ECC check bits. These 12 ECC check bits and the 64 data bits are written to the same location in memory, such as on a single memory module.

The operations performed by ECC generator 130 are described in more detail below, but conform to the (84,72) ECC block code. XOR gates and other logic, or programmable logic, or a programmable processor may be used.

Figure 7:
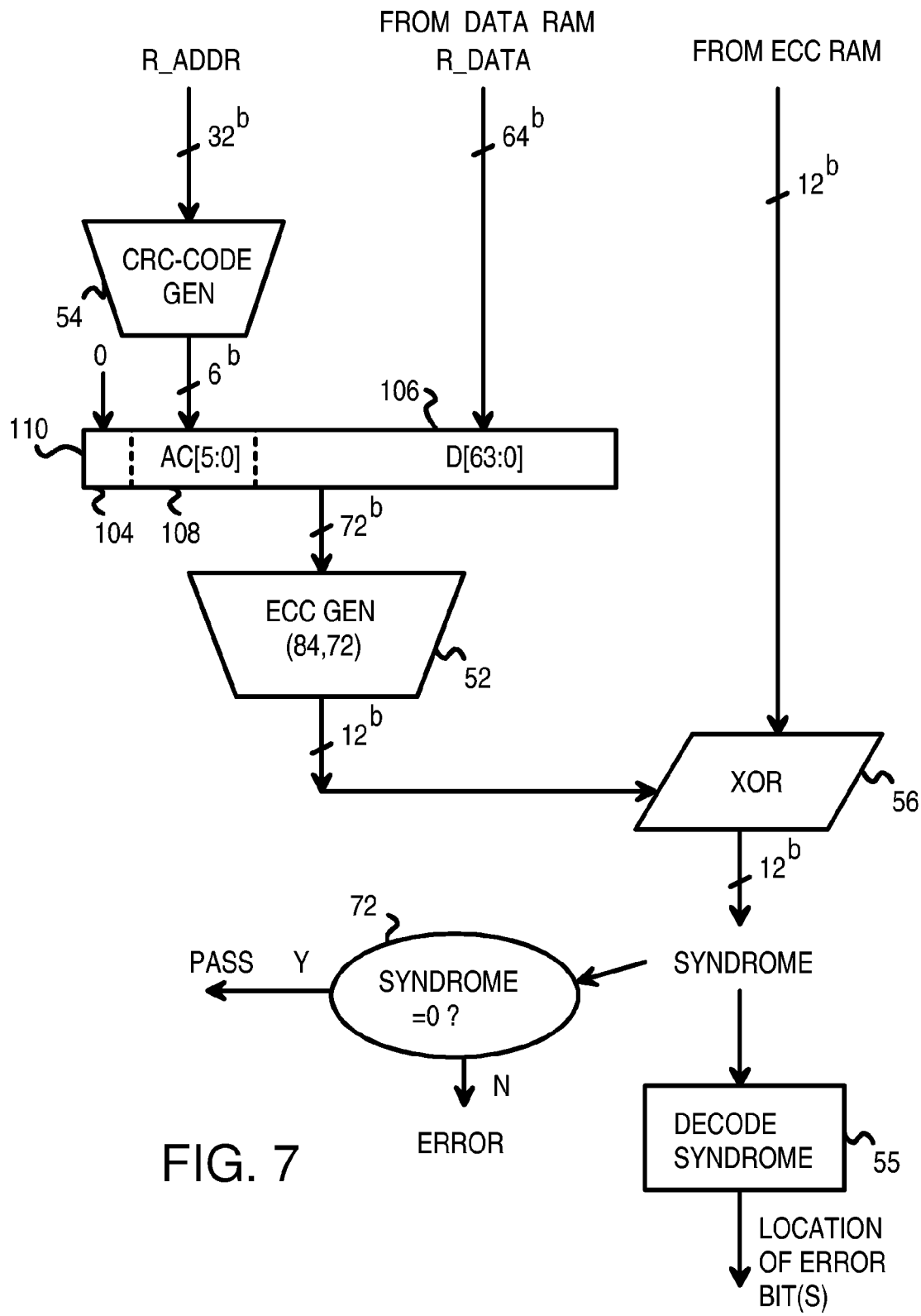
FIG. 7 is a diagram of ECC checking of address and data when reading from a memory module.

FIG. 7 is a diagram of ECC checking of address and data when reading from a memory module. A read address R_ADDR is applied to a 76-bit memory module, causing 64 data bits D[63:0] and 12 ECC check bits to be read from the memory chips on the memory module. CRC generator 54 receives the 32 address bits and generates the 6-bit CRC, bits AC[5:0] of address CRC bits 108. The same CRC operation is performed for writes by CRC generator 134 (FIG. 6) and for reads by CRC generator 54.

Check word 110 is formed by concatenating address CRC bits 108 and data bits 106 and flag bits 104. Flag bits 104 can be set to the default (non-error) values, such as 0. ECC generator 52 receives check word 110 and re-generates the 12 ECC check bits for the 72-bit check word 110. These re-generated ECC bits from ECC generator 52 are combined with the 12 ECC check bits read from the memory module by XOR logic 56. The result is a 12-bit syndrome. When the re-generated ECC check bits match the stored ECC check bits, the output of XOR logic 56 is all zeros. A non-zero syndrome value is detected by comparator 72, which signals an error. A zero-valued syndrome allows the data to be used without error.

When comparator 72 detects an error, the syndrome is decoded by syndrome decoder 55. Decoding the non-zero syndrome may indicate the bit-locations of the errors, possibly allowing error correction to occur. Syndrome decoder 55 could isolate the error location to address or data bits, or to the flag bits. Once the locations of the bits in error are known, these bits can be flipped to correct the errors.

Figure 8:
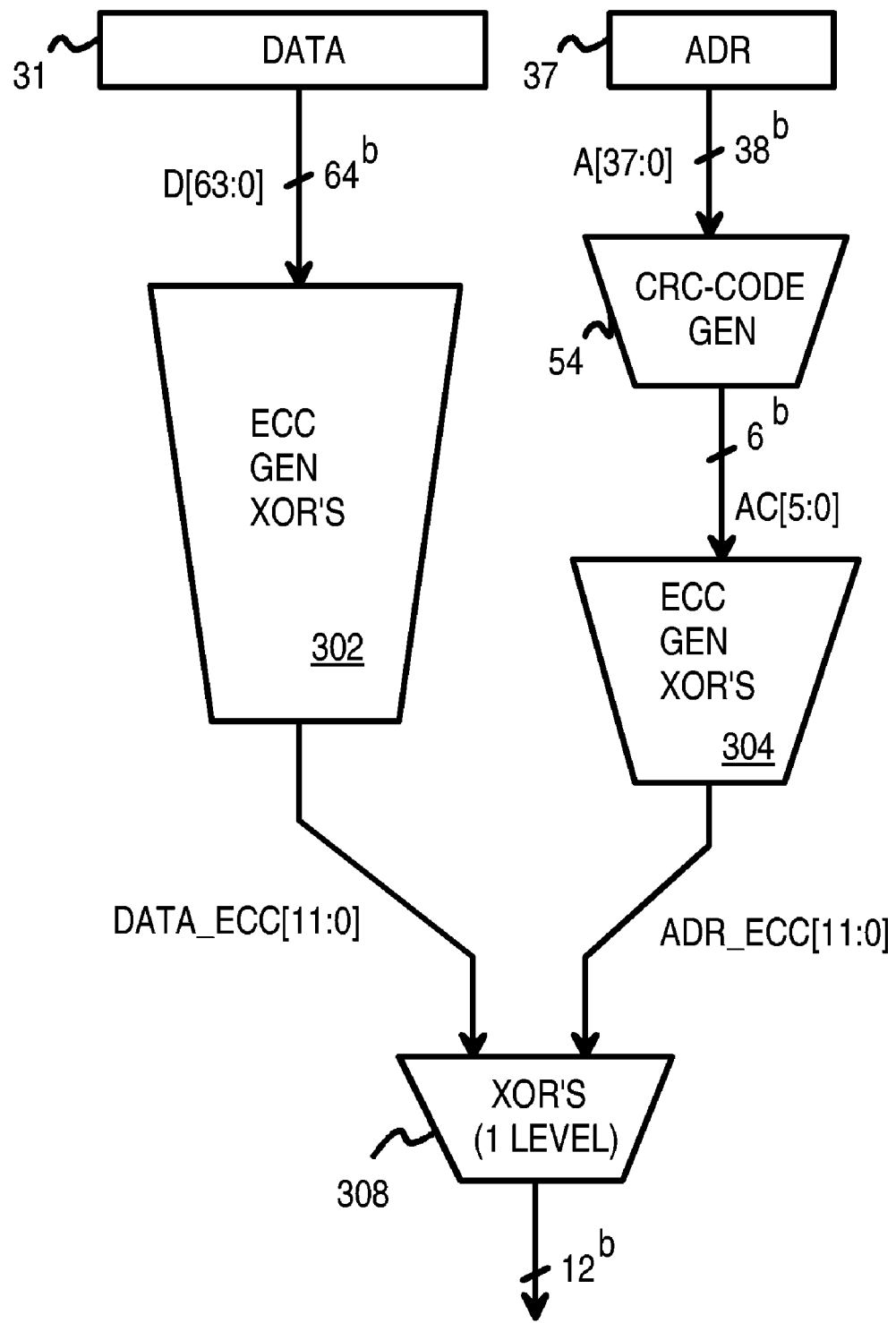
FIG. 8 shows an alternate embodiment of ECC check-bit generation that is combined and pipelined with address CRC generation.

FIG. 8 shows an alternate embodiment of ECC check-bit generation that is combined and pipelined with address CRC generation. Since address CRC generation adds more computations, the CRC computations may delay the final result. To improve performance, the address CRC can be combined with the ECC generation to generate an address ECC ADDR_ECC[11:0] for these address bits, and then the address ECC is combined with a preliminary data-bit ECC DATA_ECC[11:0] to generate the final ECC check bits, ECC [11:0].

Since there are 64 data bits D[63:0] but only 6 address CRC bits AC[5:0], the delay for combining the 64 address bits is often greater than the delay to combine 6 address CRC bits. The extra delay for the data bits due to the greater fan-in can be used to generate the address CRC in parallel with the initial stages of ECC generation of the many data bits.

The block codes for the ECC generation and the CRC generation can be reduced to XOR operations. The 64 data bits 31 are input to data ECC generator XOR tree 302, which contains a tree of XOR gates to combine the 64 data-bit inputs to generate 12 output bits DATA_ECC[11:0]. The connections of these XOR gates are determined by the particular ECC code, which is transformed into a systematic form.

Address 37 contains 38 address bits in this alternate embodiment. A[37:0] are input to CRC generator 54, which may also have a tree of XOR gates connected to perform the CRC operation to generate address CRC bits AC[5:0].

Address ECC generator XOR tree 304 contains more XOR gates to generate the contributions from the 6 address CRC bits to the 12 ECC check bits. The address ECC generated by address ECC generator XOR tree 304, ADDR_ECC[11:0], is finally combined with the preliminary data-bit ECC, DATA_ECC[11:0] by final XOR logic 308 to generate the final ECC check bits, ECC[11:0].

Since the address contributions to the 12 ECC check bits are not combined with the data contributions until the last level of XOR gates, operations on address and data inputs can be segregated and performed in parallel. This may allow for shorter overall delays and better throughput.

Figure 9A:
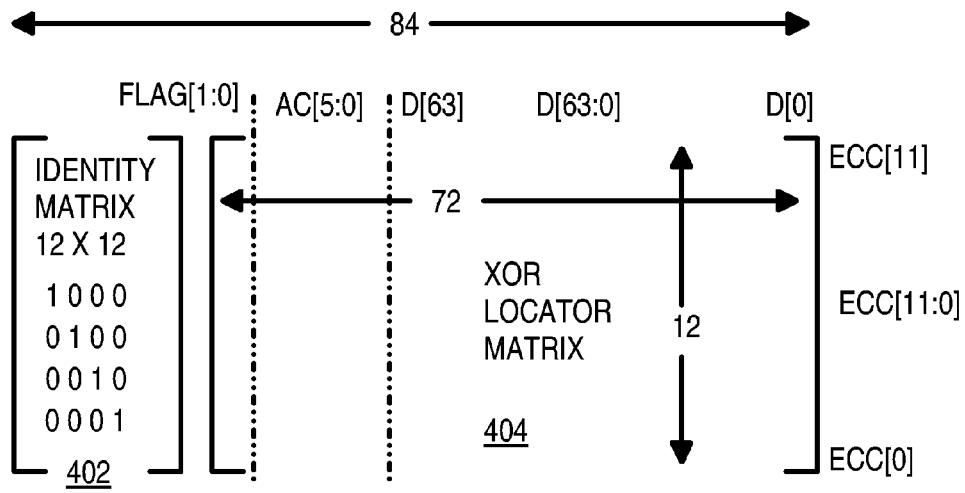
FIGS. 9A-B show a matrix that defines the operations of XOR gates in FIG. 8.
Figure 9B:
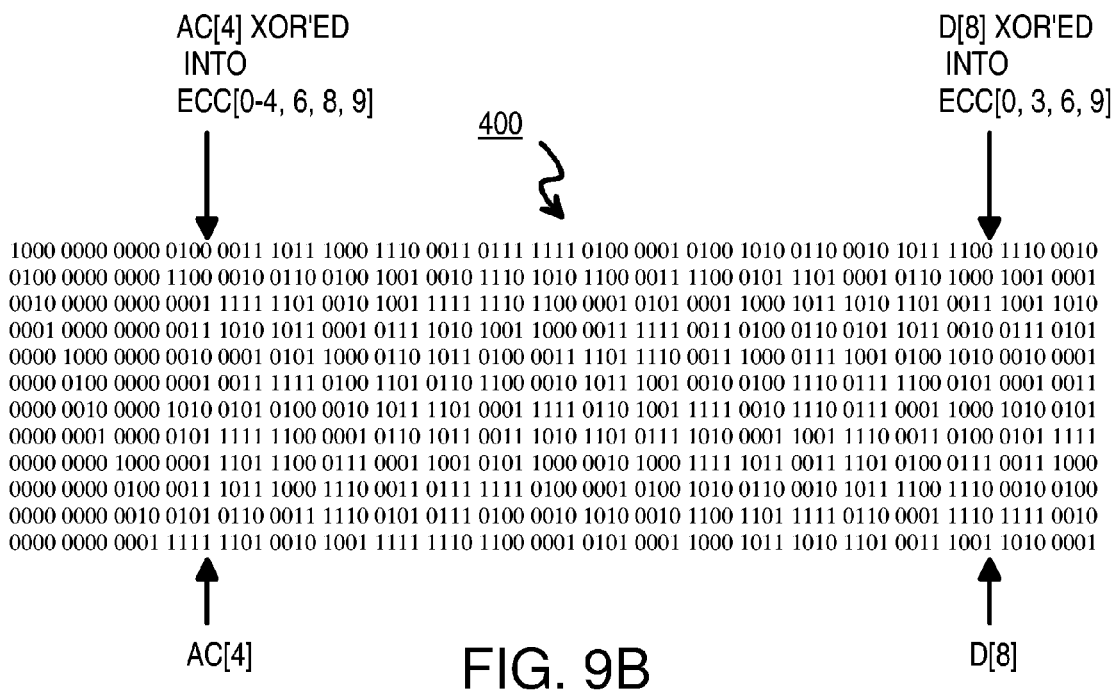

FIGS. 9A-B show a matrix that defines the operations of XOR gates in FIG. 8. FIG. 9A highlights the structure of the matrix while FIG. 9B shows numerical values of the matrix that defines XOR operations.

The inventor has carefully reviewed many possible CRC and ECC codes and has selected codes that together can achieve good detection of multi-bit data and address errors. The equations for the selected ECC code from the literature has been manipulated and transformed by the inventor to create the matrix in systematic form shown in FIGS. 9A-B. As FIG. 9A shows, identity matrix portion 402 is on the left, and is a 12×12 matrix full of zeros, but with a diagonal line of ones. XOR locator matrix portion 404 also has 12 rows, but has 72 columns.

The 12 rows correspond to the outputs of the ECC generator logic, the 12 ECC check bits ECC[11:0] that are output by final XOR logic 308 (FIG. 8). The 72 columns correspond to the inputs of the ECC generator logic, check word 110 (FIGS. 6, 7). Data bits D[63:0] correspond to the 64 columns on the right, while the 2 flag bits FLAG[1,0] correspond to the two columns on the left within XOR locator matrix portion 404. In the middle are 6 columns for address CRC bits AC[5:0].

The overall generator matrix in systematic form is a 12×84 matrix with identity matrix portion 402 on the left and XOR locator matrix portion 404 on the right. The inputs are the 64 data bits, the 2 flag bits, and the 6 address CRC bits.

Numeric values for the generator matrix are shown in FIG. 9B. The 12 left-most columns form identity matrix portion 402 as can be seen by the diagonal line of ones. The remaining portion of generator matrix 400 is XOR locator matrix portion 404. The columns correspond to inputs bits, starting with D[0] as the right-most column. The ninth column from the right corresponds to D[8] and is marked on FIG. 9B.

The 12 rows correspond to the ECC check bits generated. The bottom row is ECC[0] while the top row is ECC[11]. The ECC output for a row is the XOR of all inputs that have a 1 value in that row. For example, the top row is for generating ECC[11], and the top row has a one in the 2nd, 6th, 7th, 8th, 11th, 12th, etc. columns from the right. This can be seen by reading FIG. 9B from right-to-left along the top row, starting at the upper-right corner of the matrix. The 2nd, 6th, 7th, 8th, 11th, 12th, etc. columns correspond to inputs D[1], D[5], D[6], D[7], D[10], D[11], etc. The XOR tree that generates ECC[11] has D[1], D[5], D[6], D[7], D[10], D[11], etc. as inputs. The logic equation implemented by data ECC generator XOR tree 302 (FIG. 8) for ECC[11] is:

ECC[11]=D[1] XOR D[5] XOR D[6] XOR D[7] XOR D[10] XOR D[11], . . .

Generating the remaining terms for ECC[11] for higher-order data bits, and for address CRC bits and flag bits, may be performed in a similar manner. Logic equations implemented by data ECC generator XOR tree 302 (FIG. 8) for the other 11 ECC outputs may be determined in a similar fashion.

When a zero appears at an intersection of a row and column, the column's input bit does not logically combine to create that row's output. For the example of the first row, inputs D[0], D[2], D[3], D[4], D[8], D[9], D[14] etc. are not input to the XOR tree that generates ECC[11].

Each bit within a column indicates whether that column's input bit is logically XOR'ed into that row's ECC output. Thus D[8] in the ninth column from the right has 1 bits for rows 0, 3, 6, 9, where the bottom row is row 0 for ECC[0]. Thus D[8] is an input for generating ECC[0], ECC[3], ECC [6], ECC[9], but not for the other 8 ECC outputs.

The 6 address CRC bits are after the 64 data bits, in the 65th to 71st columns from the right. AC[4] is the 70th column and is highlighted in FIG. 9B. The AC[4] column has 1 bits for rows 0-4, 6, 8, 9, where the bottom row is row 0 for ECC[0]. Thus AC[4] is an input for generating ECC[0], ECC[1], ECC [2], ECC[3], ECC[4], ECC[6], ECC[8], ECC[9], but not for the other 4 ECC outputs.

The ECC code used to create XOR locator matrix portion 404 is selected from codes in a paper by Mitsuru Hamada, and Eiji Fujiwara: "A Class of Error Control Codes for Byte Organized Memory Systems—SbEC–(Sb+S)ED Codes", in IEEE Trans. Computers 46(1): 105-109 (1997). The inventor performed various matrix mathematical operations on the code from this paper to create XOR locator matrix portion 404.

While the generation of check bits using a CRC code in hardware and software is well known, a short description follows. CRC algorithms use modulo-2 arithmetic. Only 1's and 0's are used, and there is no borrow or carry operations in the arithmetic. Binary arithmetic additions and subtractions become simple XORs.

The algorithm treats all bit streams as Binary Polynomials. A Binary Polynomial is a polynomial with coefficients implied by the bit stream, for example $X^{}3+X+1$. The bit stream 1010101, for example, can be represented by the polynomial $X5+X3+X1+X0=X5+X3+X+1$. A logical left shift of i bits can be represented by multiplying the polynomial by $Xi$.

The address check bits are generated so a concatenation of the bit stream and check bits is exactly divisible by some pre-defined generator polynomial. If the bit stream is k bits, and the check bits are n bits, the generator polynomial represents n+1 bits.

To create the address check bits, the data polynomial is left shifted by n bits and divided by the generator polynomial. This is all done in modulo-2 arithmetic. The remainder polynomial implies the check bits. A hardware implementation of this is typically understood in terms of a shift register and XOR gates that take multiple cycles to execute. This operation can be unfolded and parallelized, so that it all happens in one cycle. The result is a set of XOR operations on the original bit stream. The correct set of XOR operations is implied by the CRC generator polynomial.

Many CRC codes are known and have been published. The inventor has examined many such codes and has selected a 6-bit CRC code published by P. Koopman and T. Chakravarty, "Cyclic Redundancy Code (CRC) Polynomial Selection for Embedded Networks", *Int'l Conf. On Dependable Sys. and Networks*, DSN-2004, pp. 1-10, 2004. The best code from this paper (in terms of least number of undetected errors) for 32 bit addresses is "0x2d", which implies a CRC generator polynomial of $x6+x4+x**3+x+1$.

The combination of the 6-bit CRC code and the ECC code has been simulated to determine error coverage. The ECC code is able to detect nibble errors with another 2-bit error that is adjacent to the nibble error, so an address error that causes all 6 bits of the 6-bit CRC to change can be detected by the ECC code. Thus address errors that cause 6 or fewer bits of the 6-bit CRC code to mis-match can be detected using the selected ECC code. Other ECC codes may not have this convenient property.

Simulating 1,000 random errors in a 32-bit address that is compressed by the selected CRC and input as a 6-bit field into check word 110 and then coded using the selected ECC, yielded the following coverage results:

0% of 1-bit address errors undetected
0% of 2-bit address errors undetected
1.66% of 3-bit address errors undetected
1.68% of 4-bit address errors undetected
1.74% of 5-bit address errors undetected
1.32% of random address errors undetected.

Thus all 1 and 2-bit address errors are detectable with the selected CRC and ECC codes. This is a useful result since addresses may be multiplexed, and a single hardware error could cause 2 address bits to fail. More complex errors of 3 or more address bits are often detected, but 2% or so of these errors are undetectable.

Furthermore, all 1 and 2 bit address errors create a unique error syndrome. The syndrome can be decoded to determine which address bit in the 32 address bits caused the error, if it is suspected that the address error is a one or two bit error. This can help with debugging or error logging.

ALTERNATE EMBODIMENTS

Several other embodiments are contemplated by the inventors. Rather than using XOR gates, exclusive-NOR (XNOR) gates or equality gates may be used. The XOR functions may be implemented by gates achieving the same Boolean algebra equivalent i.e. (A AND NOT B) OR (NOT A AND B). Inversions may be added while still retaining the properties of the code. Logic may be re-arranged and implemented in a variety of ways. Other codes may be selected and manipulated in a variety of ways. The CRC could be implemented in a less parallel form; for instance the common serial method.

The memory could be striped, interleaved, or organized in a variety of ways. More than one memory module could be accessed for a read or write, and the data and ECC could be spread across several memory modules. Each memory module could contain two or more ranks or banks. Rather than use ×4 DRAM chips, other widths could be used, and the memory module could contain chips of different widths, such as some ×8 chips and some ×4 chips. Other chips could be added to the memory module such as buffers and control logic. The data, address, and ECC-bit widths could be varied.

Not all address or data bits may be checked. Many logical and physical implementations of the functions described herein are possible, with many variations. Some address bits may not be checked, such as low-order or high-order address bits. The various steps and functions may be pipelined, altering timing. Some address locations may not have ECC storage or may not use ECC while other locations store ECC checkbits.

A variety of ECC codes and CRC generator polynomials could be used. Many technical papers have been published exploring and contrasting detection efficiency of different polynomial functions and codes. Codes that have parity matrices in systematic form, or use a rotational construction technique are particularly useful. Some ECC codes may be able to cover more than 64 data bits or less than 64 data bits.

Functional units could be re-used. For example, A single CRC-code generator could be used for both read and write addresses. A programmable arithmetic-logic-unit (ALU), digital-signal processor (DSP), or other functional unit could be programmed to perform the various operations, or dedicated logic could be used, or some combination. The read and write addresses could share the same physical lines and interface, with a read-write control signal indicating whether the address is a read address or a write address.

While a CRC code for a 32-bit or 38-bit address has been described, this or another code could be used for larger addresses, such as 40 or 64-bit address, with a degraded error detection capability. Conversely, increased error detection can result if a smaller number of address bits are used (<32).

CRC codes are desirable for generating the address check bits because the CRC-polynomial requires only 6 check bits. The higher compression of the CRC-polynomial over other codes with similar error detection is an advantage. The invention may be implemented as a memory controller that connects to standard memory modules, or modified memory modules. The final ECC check bits, or other intermediate bits, may be complemented, either individually or as a group, before use. The data or address bits may be complemented individually or as a group. A known mechanism for generating CRC codes is to seed a LFSR generator with a non-zero constant. This has the effect of selectively complementing individually bits of the address check bits. A more general function such as a linear block code could be used in place of the CRC code.

A (n,k) linear block code is defined by a generator matrix G of dimension n by k, message m of length k, and code c (message plus check bits) of length n, such that c=mG, where modulo-2 arithmetic is used. Each codeword of a linear code is thus some linear combination of the rows of G. The rows of G must be linearly independent. Since systematic linear block codes are used here, the check bits are then n−k bits of c. This CRC code generation method creates an implied (38,32) linear block code.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An error-correcting memory controller comprising:
   an address linear block code generator, receiving a write address corresponding to write data, for generating address check bits from the write address using a linear block code function;
   wherein the address check bits comprise B+Y bits, and the write address comprises at least 4×(B+Y) bits, wherein the linear block code function compresses the write address by at least 75%;
   wherein B and Y are whole numbers and B is at least 4 and Y is less than B;
   a check word formed by combining the write data and the address check bits;
   an error-correction code (ECC) generator, receiving check word, for generating ECC bits of a correction code capable of correcting an error in a sequence of B data bits, and also capable of detecting another error bit separate from the B data bits, and capable of detecting an error in the address check bits;
   a write interface to a memory for writing the ECC bits to the memory that stores the write data at a location determined by the write address;
   a read interface to the memory for reading the ECC bits as read ECC bits and for reading read data from a location determined by a read address;
   a second address linear block code generator, receiving the read address corresponding to the read data, for generating read address check bits from the read address using the linear block code function;
   a second check word formed by combining the read data and the read address check bits;
   a second ECC generator, receiving the second check word, for generating second ECC bits of the correction code;
   a comparator, receiving the read ECC bits from the read interface and receiving the second ECC bits from the second ECC generator, for signaling an error when the read ECC bits and the second ECC bits mis-match; and
   a data corrector, coupled to the comparator, for correcting up to B bits in a sequence of B bits of the read data to generate corrected data using the second ECC bits to locate errors in the read data when the error is signaled by the comparator,
   wherein the write data comprises 64 data bits and the ECC bits comprise 12 ECC bits; wherein the correction code is a (84,72) code,
   whereby data is corrected and address errors are signaled using ECC bits stored in the memory.

2. The error-correcting memory controller of claim 1 wherein the check word is formed by concatenating the write data with the address check bits;
   wherein the address check bits are in a sequence of B+Y bits in the check word.

3. The error-correcting memory controller of claim 2 wherein the correction code is capable of detecting some but not all combinations of B-bit errors in a sequence of B data bits and another Y-bit error in another sequence of B data bits;
   wherein the address check bits are located within the check word in a target sequence of (B+Y) bits, and the correction code is capable of detecting a (B+Y)-bit error in the target sequence,
   whereby multi-bit address errors are detectable.

4. The error-correcting memory controller of claim 2 wherein B is 4 and Y is 2,
   wherein the address check bits comprise 6 bits.

5. The error-correcting memory controller of claim 2 wherein the address linear block code generator, the ECC generator, and the second ECC generator each comprise a multi-input exclusive-OR (XOR) gate, or each comprise a multi-input exclusive-NOR (XNOR) gate, or each comprise a tree of XOR or XNOR gates.

6. The error-correcting memory controller of claim 2 wherein the write address comprises 32 bits;
   whereby 32 address bits are compressed to 6 bits by the linear block code function.

7. The error-correcting memory controller of claim 2 wherein the linear block code function is a cyclical-redundancy-check (CRC) function.

8. The error-correcting memory controller of claim 7 wherein the linear block code function is $X^{**}4+X+1$ wherein X is a value of the write address or a value of the read address.

9. The error-correcting memory controller of claim 1 wherein the memory is formed from 76-bit memory modules that store the 64 data bits and the 12 ECC bits in each address location.

10. The error-correcting memory controller of claim 9 wherein the 76-bit memory modules contain B-bit memory chips that store B bits per address location;
    wherein a failing B-bit memory chip can cause a B-bit error.

11. The error-correcting memory controller of claim 1 wherein the correction code contained in the ECC bits is a Single-byte Error-Correcting/Single-byte-plus-S-bit Error-Detecting SbEC-(Sb+S)ED code wherein a byte length is B.

12. The error-correcting memory controller of claim 11 wherein the B bits comprise 4 bits.

* * * * *